(12) United States Patent
Sawada et al.

(10) Patent No.: US 8,872,486 B2
(45) Date of Patent: Oct. 28, 2014

(54) FIELD INSTRUMENT HAVING A CURRENT CONTROL ELEMENT

(75) Inventors: Hideo Sawada, Tokyo (JP); Kentaro Ohya, Tokyo (JP)

(73) Assignee: Azbil Corporation, Tokyo (JP)

( * ) Notice: Subject to any disclaimer, the term of this patent is extended or adjusted under 35 U.S.C. 154(b) by 438 days.

(21) Appl. No.: 12/989,686

(22) PCT Filed: Apr. 20, 2009

(86) PCT No.: PCT/JP2009/057845
§ 371 (c)(1),
(2), (4) Date: Oct. 26, 2010

(87) PCT Pub. No.: WO2009/133781
PCT Pub. Date: Nov. 5, 2009

(65) Prior Publication Data
US 2011/0043183 A1    Feb. 24, 2011

(30) Foreign Application Priority Data
Apr. 28, 2008   (JP) .................................. 2008-116859

(51) Int. Cl.
*G05B 9/02*    (2006.01)
(52) U.S. Cl.
CPC ........................................ *G05B 9/02* (2013.01)
USPC ........................................................ 323/266
(58) Field of Classification Search
USPC ........ 363/16, 17, 98, 132; 323/298, 266, 268, 323/270, 273; 367/99, 908
See application file for complete search history.

(56) References Cited

U.S. PATENT DOCUMENTS

| | | | |
|---|---|---|---|
| 5,055,993 A * | 10/1991 | Miyata et al. | 363/98 |
| 6,388,431 B1 * | 5/2002 | Kramer et al. | 323/266 |
| 6,535,161 B1 * | 3/2003 | McEwan | 342/124 |
| 6,822,764 B1 * | 11/2004 | Okabe et al. | 358/442 |

(Continued)

FOREIGN PATENT DOCUMENTS

| CN | 1849498 A | 10/2006 |
|---|---|---|
| CN | 101111989 A | 1/2008 |

(Continued)

OTHER PUBLICATIONS

"Two wire transmitter circuit" China Academic Journal Electronic Publishing House; No. 5; (1995), pp. 38-40.

(Continued)

*Primary Examiner* — Gary L Laxton
*Assistant Examiner* — Trinh Dang
(74) *Attorney, Agent, or Firm* — Troutman Sanders LLP

(57) ABSTRACT

A current control element (variable resistance element) is provided on a supply path of the current from a voltage regulator to another voltage regulator. An alarm driving circuit is provided on a branch flow path of the current from the voltage regulator to the voltage regulator. When the alarm driving circuit needs to be operated, a current control element controlling unit controls the resistance value of the current control element to branch the current flowing through the supply path to the branch flow path. In this case, the current branched to the branch flow path is set to the amount required to operate the alarm driving circuit. Since the sum of the currents is supplied to the voltage regulator and is the same as the current flowing before the alarm driving circuit is activated, there is no shortage of supplied power to a CPU.

2 Claims, 3 Drawing Sheets

(56) References Cited

U.S. PATENT DOCUMENTS

| | | | |
|---|---|---|---|
| 6,930,956 B2 * | 8/2005 | Mercier | 367/99 |
| 7,293,470 B2 | 11/2007 | Mansfield | |
| 7,456,739 B2 * | 11/2008 | Inomata et al. | 340/552 |
| 2006/0055249 A1 * | 3/2006 | Choi | 307/139 |
| 2007/0038390 A1 | 2/2007 | Mansfield | |

FOREIGN PATENT DOCUMENTS

| | | |
|---|---|---|
| JP | H06-169486 A | 6/1994 |
| JP | 11-183575 A | 7/1999 |
| JP | 3299556 B2 | 4/2002 |
| JP | 2004-151941 A | 5/2004 |
| JP | 2006-323661 A | 11/2006 |

OTHER PUBLICATIONS

Chinese Office Action, dated Dec. 13, 2012 which issued during the prosecution of Chinese Patent Application No. 200980114832.3.

* cited by examiner

Background Art

FIELD INSTRUMENT HAVING A CURRENT CONTROL ELEMENT

CROSS REFERENCE TO PRIOR APPLICATIONS

This application is a U.S. National Phase application under 35 U.S.C. §371 of International Application No. PCT/JP2009/057845, filed on Apr. 20, 2009 and claims benefit of priority to Japanese Patent Application No. 2008-116859, filed on Apr. 28, 2008. The International Application was published in Japanese on Nov. 5, 2009 as WO 2009/133781 under PCT Article 21(2). All of these applications are herein incorporated by reference.

TECHNICAL FIELD

This invention relates to a field device that adjusts, according to a measurement value, the value of current flowing through a two-wire transmission path.

BACKGROUND OF THE INVENTION

Conventionally, field instruments such as differential pressure/pressure transmitters, electromagnetic flow meters, positioners and the like that use two-wire transmission paths have been equipped with a CPU, and in addition to the primary measurement and control functions of the instrument, some instruments have also had secondary functions such as for outputting the operating status (normal or abnormal) of the instrument itself to the exterior and for outputting pulses.

The primary measurement and control functions are normally implemented continuously, while the secondary functions are operated periodically or non-periodically based on instructions from the CPU, and do not operate at other times. That is, based on instructions from the CPU, the secondary functions are caused to operate only when necessary.

A two-wire field instrument does not have a dedicated power supply line and instead must generate its operating power using a current of 4 to 20 mA sent from a two-wire transmission path. In other words, when measurement values are output, currents of 4 to 20 mA are considered to be within the adjustable range and are used, and therefore the primary measurement and control functions must be implemented using a current of less than 4 mA. Here, if the aforementioned secondary functions are constantly operated, the operation of the primary measurement and control functions will be obstructed. Therefore, the secondary functions are operated only when necessary (for example, see Patent Reference Document 1 (Japanese Patent Laid-Open Publication No. H11-183575)).

FIG. 4 shows the configuration of the main part of a conventional two-wire field instrument. In this figure, reference numeral 100A denotes the field instrument and reference numeral 200A denotes a higher-level device (monitoring device) connected via a two-wire transmission path AL (AL1 and AL2) to the field instrument 100A. In this example, the field instrument 100A is a differential pressure/pressure transmitter.

The field instrument 100A is comprised of a sensor unit 1A that receives pressure and differential pressure and generates an analog signal according to the magnitude thereof, an A/D converter 2A that converts the analog signal from the sensor unit 1A into a digital signal, a CPU 3A that samples the digital signal output from the A/D converter 2A and calculates the measurement value of the pressure/differential pressure, a D/A converter 4A that converts the digital measurement value calculated by the CPU 3A into a corresponding analog signal having a predetermined current range (4 to 20 mA), a communication unit 5A that outputs the analog signal outputted from the D/A converter 4A to a two-wire transmission path AL, a voltage regulator (first power supply unit) 6A that, based on the 4 to 20 mA of current obtained from the two-wire transmission path AL, generates a stable DC voltage V1 (DC 6.5V) as a first power supply, a voltage regulator 7A that receives a supply of power from the voltage regulator 6A and generates a stable DC voltage V2 (DC 3V) as a second power supply, an alarm driving circuit 8A, a selector switch 9A, a ROM 10A, and a RAM 11A.

In the field instrument 100A, the CPU 3A receives a supply of power from the voltage regulator 7A and operates, and while accessing the RAM 11A, operates according to a program stored in the ROM 10A. The ROM 10A stores a measurement value processing program that samples the digital signal from the A/D converter 2A, calculates the pressure/differential pressure measurement value and notifies a monitoring device 200A and also a selector switch control program that detects abnormalities occurring inside the instrument itself and turns ON the selector switch 9A.

FIG. 4 shows a measurement value calculation unit 3A1 and a selector switch control unit 3A2 as function blocks within the CPU 3A, but the measurement value calculation unit 3A1 and the selector switch control unit 3A2 are realized as processing functions according to the program of the CPU 3A.

Also, in this example, the alarm driving circuit 8 is a contact output circuit comprised of a photocoupler provided with a light emitting part and a light receiving part. In this case, when the selector switch 9A is turned ON, current from the voltage regulator 7A flows as drive current to the light emitting part of the alarm driving circuit (photocoupler) 8A, the light emitting part receives this drive current and emits light that is received by the light receiving unit, and the contact output at the light receiving unit side turns ON to activate an externally attached alarm circuit 300A.

The alarm driving circuit 8A is implemented with a photocoupler for the reasons of ensuring the electrical isolation between input and output, and so as not to generate noise that would affect the processing operations of the CPU 3A.

However, in the field instrument 100A described above, with the alarm driving circuit 8A, a drive current of at least 1 mA is required for the light emitting part of the photocoupler, and therefore if an attempt is made to use a high-performance CPU as the CPU 3, there will be insufficient power to drive the CPU 3A.

Accordingly, with the conventional field instrument 100A, in cases where there was a desire to use a high-performance CPU as the CPU 3A, installation of the alarm driving circuit 8A had to be abandoned. Otherwise, the only alternative was to tolerate a degradation of CPU performance (degradation of performance of primary processing functions) and reduce the power required for the CPU and install the alarm driving circuit 8A.

The present invention was devised to solve this type of problem, and an object of the present invention is to provide a field instrument capable of operating secondary functions only when needed, without degrading the performance of the primary processing functions.

SUMMARY OF THE INVENTION

To achieve this object, the present invention includes a current value adjustment means for adjusting, according to a measurement value, the value of current flowing through a two-wire transmission path, a first power supply unit for generating a first power supply from the current flowing though the transmission path, a second power supply unit for receiving a supply of power from the first power supply unit and generating a second power supply, a processing unit for receiving a supply of power from the second power supply unit and carrying out a predetermined processing operation, a current control element provided on the supply path of current flowing from the first power supply unit toward the second power supply unit, and a load circuit provided on the branch flow path of current flowing from the first power supply unit toward the second power supply unit; wherein the processing unit has a current control element control means for controlling the element status of the current control element as necessary and causing the current flowing through the supply path and toward the second power supply unit to branch to the branch flow path in the amount required to operate the load circuit.

In the present invention, the processing unit controls the element status of the current control element as necessary, causing the current flowing through the supply path toward the second power supply unit to branch to the branch flow path in the amount required for operation of the load circuit. That is, if there is no need to operate a secondary function, the current flowing through the supply path is sent to the second power supply unit without being branched to the branch flow path. If operation of a secondary function is needed, the processing unit controls the element status of the current control element, causing the current flowing through the supply path to branch to the branch flow path. At this time, the amount of current that branches to the branch flow path is set to the amount required to operate the load circuit. The current that is branched to the branch flow path passes through the load circuit and is sent to the second power supply unit. As a result, the sum of the currents from the supply path and from the branch flow path is supplied to the second power supply unit. In this case, because the amount of current supplied to the second power supply unit is the same as when there is no need to operate a secondary function, there will not be an insufficient supply of power to the processing unit. Accordingly, secondary functions operated only when necessary can be activated without degrading the performance of the primary processing functions.

According to the present invention, a current control element is provided on a supply path of the current from a first power supply unit to a second power supply unit, a load circuit is provided on a branch flow path of the current from the first power supply unit to the second power supply unit, and the processing unit is provided with a current control element control means for controlling the element status of the current control element as necessary and for causing the current flowing through the supply path and toward the second power supply unit to branch to the branch flow path in the amount required to operate the load circuit, and therefore when a secondary function needs to be operated, the sum of the current from the supply path and the current from the branch flow path is supplied to the second power supply unit and the amount of current supplied to the second power supply unit is the same as when there is no need to operate a secondary function, so that there will not be an insufficient supply of power to the processing unit, and secondary functions operated only when necessary can be activated without degrading the performance of the primary processing functions.

DETAILED DESCRIPTION OF THE INVENTION

Figure 1:
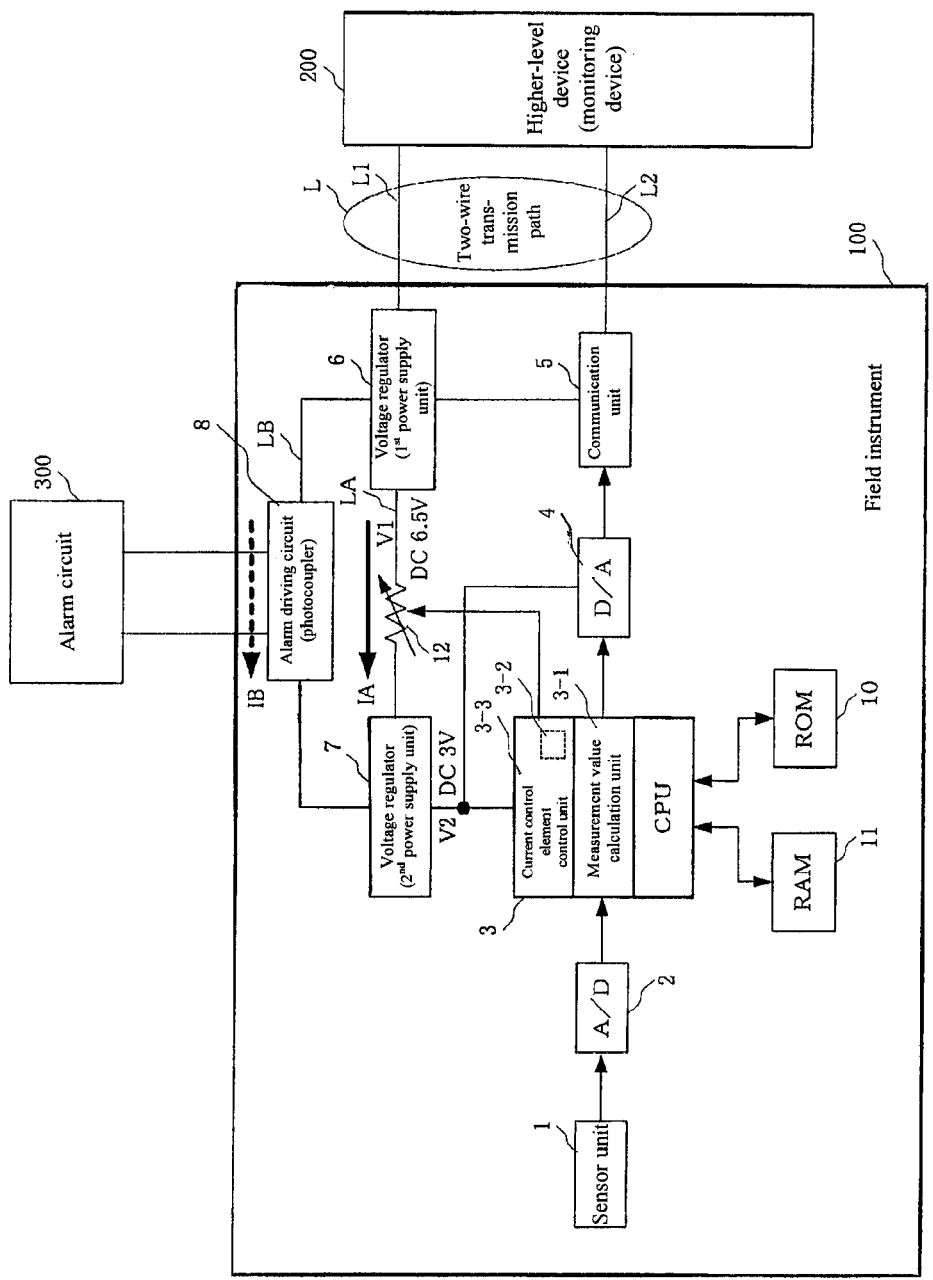
FIG. 1 is a block diagram showing the main part of an example of the field instrument of the present invention.

Below, the present invention is described in detail with reference to drawings. FIG. 1 is a block diagram showing the main part of an example of the field instrument of the present invention. In this figure, reference numeral 100 denotes the field instrument of the present invention and reference numeral 200 denotes a high-level device (monitoring device) that is connected via a two-wire transmission path L (L1, L2) to the field instrument 100. In this example, the field instrument 100 is a differential pressure/pressure transmitter.

The field instrument 100 includes a sensor unit 1 that receives pressure and differential pressure and generates an analog signal according to the magnitude thereof, an A/D converter 2 that converts the analog signal from the sensor unit 1 into a digital signal, a CPU 3 that samples the digital signal output from the A/D converter 2 and calculates the measurement value of the pressure/differential pressure, a D/A converter 4 that converts the digital measurement value calculated by the CPU 3 into a corresponding analog signal having a predetermined current range (4 to 20 mA), a communication unit 5 that outputs the analog signal outputted from the D/A converter 4 to the two-wire transmission path L, a voltage regulator (first power supply unit) 6 that, based on the 4 to 20 mA of current obtained from the two-wire transmission path L, generates a stable DC voltage V1 (DC 6.5V) as a first power supply, a voltage regulator 7 that receives a supply of power from the voltage regulator 6 and generates a stable DC voltage V2 (DC 3V) as a second power supply, an alarm driving circuit 8, a ROM 10, a RAM 11, and a current control element 12.

The main points of difference between this field instrument 100 and the conventional field instrument 100A are the provision of the current control element 12 on the supply path LA for current that flows from the voltage regulator 6 to the voltage regulator 7, the provision of the alarm driving circuit 8 on the branch flow path LB for current that flows from the voltage regulator 6 to the voltage regulator 7, and the control, as needed, of the element state of the current control element 12 by the CPU 3.

As the current control element 12, a MOS-FET, J-FET, bipolar transistor, variable resistive element or the like is used, for example. In this example, to simplify the explanation, the case in which a variable resistive element is used as the current control element 12 is shown. Here, the CPU 3 controls the resistance value of the current control element 12 as the element state of the current control element 12.

In the field instrument 100, the CPU 3 receives a supply of power to operate from the voltage regulator 7 and operates, and while accessing the RAM 11, operates according to a program stored in the ROM 10. The ROM 10 stores a measurement value processing program that samples the digital signal from the A/D converter 2, calculates the pressure/differential pressure measurement value and notifies the monitoring device 200 and also a current control element program which, as a distinctive program of this embodiment, detects abnormalities occurring inside the instrument itself and controls the resistance value of the current control element 12.

FIG. 1 shows a measurement value calculation unit 3-1 and a current control element control unit 3-3 as function blocks within the CPU 3, but the measurement value calculation unit 3-1 and the current control element control unit 3-3 are realized as processing functions according to the program of the CPU 3A. Moreover, the alarm driving circuit 8 is a contact output circuit comprised of a photocoupler provided with a light emitting part and a light receiving part.

If operation of a secondary function is not needed, i.e., if there is no need to operate the alarm driving circuit 8, the current control element control unit 3-3 sets the resistance value of the current element control 12 to 0. As a result, the current IA flowing through the supply path LA is sent to the voltage regulator 7 without branching to the branch flow path LB. Here, IB=0, where IB is the current flowing though the branch flow path LB.

If operation of a secondary function is needed, i.e., if there is a need to operate the alarm driving circuit 8, the current control element control unit 3-3 controls the resistance value of the current element control 12, causing the current flowing through the supply path LB to branch to the branch flow path LB. At this time, the amount of current IB that branches to the branch flow path LB is set to the amount required to operate the alarm driving circuit 8.

With the alarm driving circuit 8, a drive current of at least 1 mA is required for the light emitting part of the photocoupler. The current control element control unit 3-3 adjusts the resistance value of the current control element 12 to reduce the current IA flowing through the supply path LA, and a portion of the current IA that had previously flowed through the supply path LA is branched to the branch flow path LB, ensuring the drive current required for operation of the alarm driving circuit 8 as the branch current IB.

As a result, the branch current IB flows as drive current to the light emitting part of the alarm driving circuit (photocoupler) 8, the light emitting part receives this drive current and emits light that is received by the light receiving unit, and the contact output at the light receiving unit side turns ON to activate an externally attached alarm circuit 300.

The branch current IB supplied to the alarm driving circuit 8 is sent through the light emitting part of the alarm driving circuit 8 to the voltage regulator 7. As a result, the sum of the current IA from the supply path LA and the current IB from the branch flow path is supplied to the voltage regulator 7. In this case, because the amount of current supplied to the voltage regulator 7 is the same as when there is no need to operate the alarm driving circuit 8, there will not be an insufficient supply of power to the CPU 3. Accordingly, the alarm driving circuit 8 can be operated without degrading the performance of the CPU 3 (without degrading the performance of the primary processing functions).

In this example, the CPU 3 controls the resistance value of the current control element 12 as necessary, causing the current IA flowing through the supply path LA toward the voltage regulator 7 to branch to the branch flow path LB, but at this time, in the case where causing the current IA flowing through the supply path LA toward the voltage regulator 7 to branch to the branch flow path LB is judged to not have an effect on the processing operation of the CPU 3 itself, the control of the resistance value of the current control element 12 may be enabled.

For example, in the case where causing the current IA flowing through the supply path LA toward the voltage regulator 7 to branch to the branch flow path LB is judged to not have an effect on the processing operation of the CPU 3 itself, a current control element control enable unit 3-2 for enabling control of the resistance value of the current control element 12 is provided as one function of the current control element control unit 3-3. In this case, if the current IA flowing through the supply path LA toward the voltage regulator 7 is caused to branch to the branch flow path LB, causing the alarm driving circuit 8 to operate, and if power supply fluctuations and the like occur and risk affecting the processing operation of the CPU 3, such risk is detected in advance and the control of the resistance value of the current control element 12 is disabled. As a result, operation of the alarm driving circuit 8 is possible without affecting the primary processing functions of the CPU 3.

Figure 2:
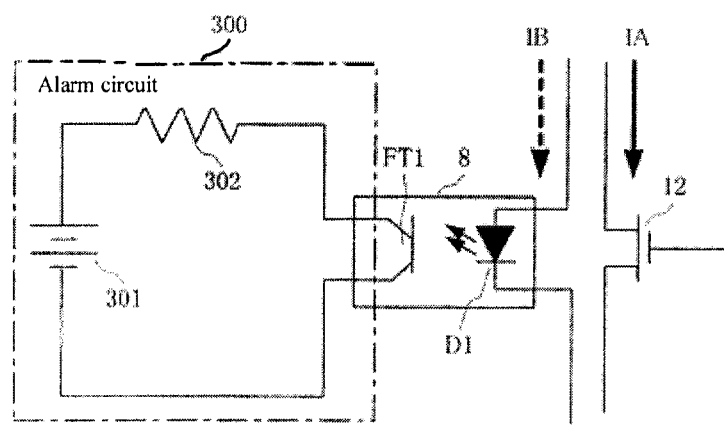
FIG. 2 is a drawing showing the main part of a circuit example in which a FET is used as a current control element in the field instrument.

In the aforementioned example, in order to simplify the explanation, a variable resistive element was used as the current control element 12, but as described above, an element such as a J-FET or bipolar transistor may also be used. FIG. 2 shows the main part of a circuit example in which a FET is used as the current control element 12. In the figure, reference symbol D1 denotes a light emitting diode provided as the light emitting part of the alarm driving circuit 8, reference symbol FT1 denotes a phototransistor provided as light receiving part of the alarm driving circuit 8, the phototransistor FT1 is inserted into and connected to the series circuit that links a power supply 301 to a load 302, such as an alarm lamp, in the alarm circuit 300.

Moreover, in the example described above, the alarm driving circuit 8 was a photocoupler, but needless to say, the alarm driving circuit is not limited to a photocoupler. By equipping the alarm driving circuit 8 with an input unit that receives the supply of current IB from the branch flow path LB and operates, and an output unit that turns ON in response to the operation of the input unit, and by using an isolating switch in which the input unit and output unit are electrically isolated, the electrical isolation between input and output can be ensured, and noise that would affect the processing operation of the CPU 3 is not generated.

Figure 3:
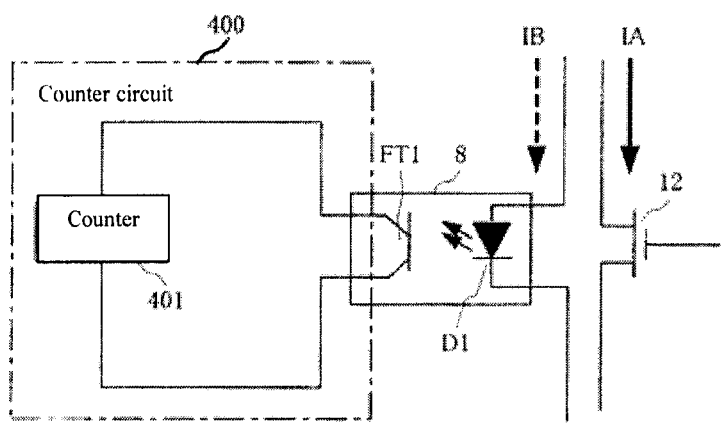
FIG. 3 is a drawing showing the main part of a circuit example in which an alarm driving circuit is used as a pulse output circuit of a counter circuit in the field instrument.
Figure 4:
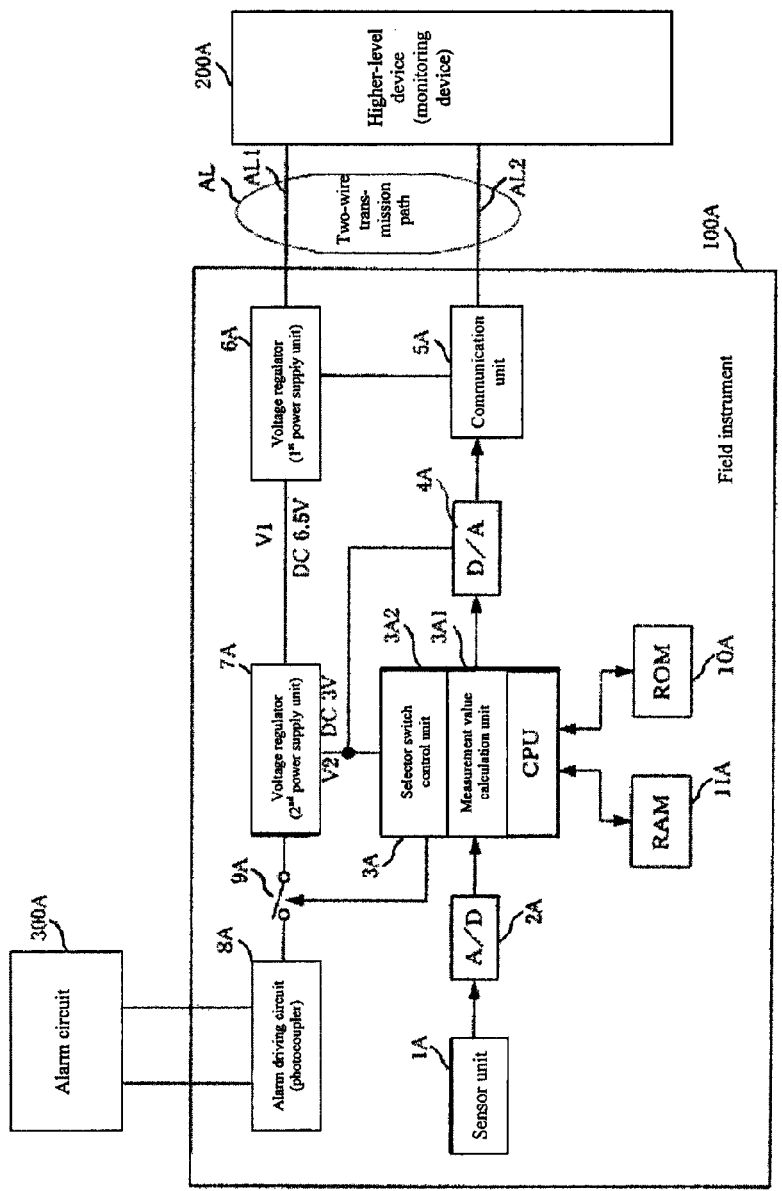
FIG. 4 is a block diagram showing the configuration of the main part of a conventional two-wire field instrument.

Moreover, in the aforementioned example described above, the alarm driving circuit 8 was used as the contact output circuit of the alarm circuit 300, but as shown in FIG. 3, the alarm driving circuit 8 may also be used as a pulse output circuit of a counter circuit 400 provided with a counter 401. Moreover, an alarm lamp or alarm buzzer may be provided instead of the alarm driving circuit 8.

Moreover, in the aforementioned example described above, the processing unit that received a supply of power from the voltage regulator 7 and carried out predetermined operations was CPU 3, but because a CPU is not necessarily required, a hardware circuit having the equivalent processing functions may also be used.

As a field instrument that adjusts the value of current flowing through a two-wire transmission path according to a measurement value, the field instrument of the present invention is applicable to process control and other various sectors.

The invention claimed is:
1. A field instrument comprising:
a current value adjustor adjusting, according to a measurement value, the value of current flowing through a two-wire transmission path;
a first power supply unit generating a first power supply from the current flowing though said transmission path;
a second power supply unit receiving a supply of power from the first power supply unit and generating a second power supply;

a processing unit receiving a supply of power from the second power supply unit and carrying out a predetermined processing operation;

a current control element provided on a supply path of current flowing from said first power supply unit toward said second power supply unit; and a load circuit provided on a branch flow path of current flowing from said first power supply unit toward said second power supply unit, wherein one end of the branch flow path, which is connected to the first power supply unit, is connected to one end of the load circuit, and another end of the branch flow path, which is connected to the second power supply unit, is connected to another end of the load circuit, wherein the branch path having the load circuit branches out form the supply path and runs separately from and in parallel to the supply path between the first power supply and the second power supply, and serves as a secondary path to the supply path, wherein said processing unit comprises a current control element controller controlling the element status of said current control element as necessary and causing the current flowing through said supply path and toward said second power supply unit to branch to said branch flow path in the amount required to operate said load circuit, and wherein said processing unit comprises a controller enabling control of an element state of said current control element in a case when said processing unit determines that it does not have an effect on the processing operation of said processing unit to cause the current, which flows through said supply path from said first power supply toward said second power supply, to branch out to said branch flow path.

2. The field instrument according to claim 1, wherein the branch flow path is provided independently from the supply path, between the first power supply unit and the second power supply unit, to branch out the current flowing through the supply path to flow in parallel to the supply path.

* * * * *